United States Patent
Watanabe

[11] Patent Number: 5,818,286
[45] Date of Patent: Oct. 6, 1998

[54] INTEGRATED CIRCUIT DEVICE CAPABLE OF MAKING A BURN-IN SETTING AND TEST MODE SETTING TO RUN A BURN-IN AND A TEST MODE OPERATION

[75] Inventor: Toshio Watanabe, Kitakatsuragi-gun, Japan

[73] Assignee: Sharp Kabushiki Kaisha, Osaka, Japan

[21] Appl. No.: 690,828

[22] Filed: Aug. 1, 1996

[30] Foreign Application Priority Data

Dec. 28, 1995  [JP]  Japan ..................................... 7-343076

[51] Int. Cl.$^6$ ....................................................... G05F 3/02
[52] U.S. Cl. .......................... 327/530; 327/198; 327/546; 327/143
[58] Field of Search ..................................... 327/530, 142, 327/143, 198, 404, 408, 546, 538

[56] References Cited

U.S. PATENT DOCUMENTS 5,448,199  9/1995  Park .......................................... 327/525

FOREIGN PATENT DOCUMENTS 4-218938  10/1992  Japan .

*Primary Examiner*—Timothy P. Callahan
*Assistant Examiner*—Dinh Le

[57] ABSTRACT

An integrated circuit device provided with (a) an auto-clear circuit for outputting an auto-clear signal in response to a supply of the power source, (2) a mode signal generating circuit for generating a burn-in mode signal or test mode signal based on the auto-clear signal, and for generating a normal mode signal based on a reset signal or operation start signal, and (3) a mode setting circuit for making one of the burn-in setting and the test mode setting respectively in response to the burn-in mode signal and test mode signal, whichever inputted, and for making normal mode setting upon input of the normal mode signal. The present integrated circuit device omits a mode-setting-only input terminal which used to be provided separately only for making the burn-in setting or test mode setting. As a result, a system employing the present integrated circuit device can be designed more flexibly and downsized as well.

5 Claims, 7 Drawing Sheets

INTEGRATED CIRCUIT DEVICE CAPABLE OF MAKING A BURN-IN SETTING AND TEST MODE SETTING TO RUN A BURN-IN AND A TEST MODE OPERATION

FIELD OF THE INVENTION

The present invention relates to an integrated circuit device, such as a semiconductor integrated circuit device, and more particularly, to an integrated circuit device capable of making the burn-in setting and test mode setting to run a burn-in and a test mode operation, respectively.

BACKGROUND OF THE INVENTION

When an integrated circuit device is assembled, various kinds of tests are conducted after an internal circuit is produced. This is because the internal circuit frequently has some defects at the start-up period and revealing the defects in advance can prevent such possible defects. In addition to the tests conducted under actual operating conditions, examples of these tests include a burn-in, a test mode operation, etc.

In the burn-in, the internal circuit of the integrated circuit device is operated under the actual operating conditions to reveal defects. As a result, possible defects of the integrated circuit device at the start-up period can be prevented. On the other hand, in the test mode operation, the internal circuit is operated under the conditions different from the actual ones, or a test-only internal circuit is used. As a result, the test can be accelerated or a detailed operation test can be conducted.

The above integrated circuit device includes a separate mode-setting-only input terminal. The burn-in setting or test mode setting of the integrated circuit is made through this mode-setting-only input terminal, and the burn-in or test mode operation is conducted upon input of a test signal through this mode-setting-only input terminal or using a signal generated within the integrated circuit device.

FIG. 4 shows an example structure of a conventional integrated circuit device capable of making the burn-in setting or test mode setting. In the drawing, numeral 41 denotes an internal circuit, numeral 42 denotes a mode setting circuit, numeral 43 denotes a power source terminal, numeral 44 denotes a ground terminal (GND), numeral 45 denotes a mode-setting-only input terminal (MODE) into which a mode signal MODE is inputted, numeral 46 denotes an operation clock CK input terminal (CK), and numeral 47 denotes an input terminal (SP) into which an operation start signal or reset signal is inputted.

According to the conventional integrated circuit device of FIG. 4, the burn-in setting or test mode setting is made by maintaining the mode-setting-only input terminal 45 (MODE) at "L" (binary low level). The input terminal 47 (SP) of FIG. 4 is a terminal into which an operation start signal or reset signal for the integrated circuit device is inputted. The integrated circuit device remains in unstable operating conditions until a pulse SP signal staying at "H" (binary high level) for a predetermined period is inputted into the input terminal 47 (SP). After the pulse SP signal is inputted into the input terminal 47 (SP), the integrated circuit device shifts to stable operating conditions and starts the normal operation. The input terminal 46 (CK) of FIG. 4 is a terminal into which an operation clock CK of the integrated circuit device is inputted.

The above conventional integrated circuit device starts the normal operation only when the burn-in setting or test mode setting is cleared. These settings are cleared by switching the mode-setting-only input terminal 45 (MODE) to "HH", and after these setting are cleared and a signal necessary for the normal operation is inputted, the integrated circuit device starts the normal operation.

FIG. 5 is a view showing the operation timing of the above conventional integrated circuit device of FIG. 4. To be more specific, the power source is supplied at timing T0 while the mode-setting-only input terminal 45 (MODE) is maintained at "L". As long as the mode-setting-only input terminal 45 (MODE) is maintained at "L", the integrated circuit device does not perform the normal operation and performs the burn-in or test mode operation.

Then, at timing T1, the pulse SP signal staying at "H" for a predetermined period and the operation clock CK are inputted into the input terminal 47 (SP) and input terminal 46 (CK), respectively. However, since the mode-setting-only input terminal 45 (MODE) is maintained at "L", the integral circuit device does not start the normal operation, and remains in the burn-in setting or test-mode setting conditions.

When the mode setting input terminal 45 (MODE) is switched to "H" at timing T2, the integrated circuit device shifts the conditions and waits for an operation signal to start the normal operation.

At timing T3, a pulse SP signal staying at "H" for a predetermined period and an operation clock CK are inputted into the input terminal 47 (SP) and input terminal 46 (CK), respectively, upon which the integrated circuit device starts the normal operation.

In FIG. 5, the pulse SP signal staying at "H" for a predetermined period and the operation clock CK are inputted respectively into the input terminal 47 (SP) and input terminal 46 (CK) at timing T1 to illustrate the timing at which the operating conditions shift. Generally, the mode-setting-only input terminal 45 (MODE) is switched to "H" to shift the operation mode to the normal operation mode first, thence the pulse SP signal and operation clock signal CK are inputted into their respective input terminals.

The above conventional integrated circuit device is disclosed in Japanese Laid-Open Patent Application No. 4-218938 (1992). The integrated circuit device disclosed therein receives no input signal from an external device to run the burn-in, and it uses an operation signal generated within the integrated circuit device. Therefore, the above integrated circuit device can omit a terminal into which a signal necessary to start the operation, such as a clock signal, is inputted. However, a separate terminal controlling the burn-in is still indispensable to the above integrated circuit device.

The above conventional integrated circuit device must have the mode-setting-only input terminal 45 (MODE) separately for making the burn-in setting or test mode setting. This not only increases the tip area of the integrated circuit device, but also demands a separate terminal in the package sealing the integrated circuit device as well.

As the performance of today's integrated circuit device upgrades, the number of the input/output terminals increases. On the other hand, there has been an increasing need for an integrated circuit device with fewer input/output terminals to increase package density. Particularly, in case of an integrated circuit device sealed in a TCP (Tape Carrier Package) having a limited number of connecting terminals for input signals, providing a separate input terminal, which is used only for making the burn-in setting or test mode setting and never used during the normal operation, causes a problem when designing the circuitry of a system employing the integrated circuit device or downsizing such a system.

Further, an operation test for preventing possible defects at the start-up period, such as the burn-in, is run on a plurality of the integrated circuit devices in parallel to improve time efficiency of the test. To do so, a signal necessary for the operation is inputted into these integrated circuit devices in parallel. This means that the number of lines connecting the testing device and individual integrated circuit devices increases in proportion to the number of the integrated circuit devices, thereby extending the time required to connect all these lines.

SUMMARY OF THE INVENTION

It is therefore an object of the present invention to provide an integrated circuit device capable of:

(1) allowing more flexible design for a system employing the integrated circuit device; (2) downsizing such a system; and (3) shortening the time required to connect the testing device and integrated circuit devices through lines preparatory to the operation test.

To fulfill the above object, an integrated circuit device of the present invention is provided with:

an auto-clear circuit for outputting an auto-clear signal in response to a supply of a power source;

a mode signal generating circuit for generating a burn-in mode signal or a test mode signal based on the auto-clear signal, and for generating a normal mode signal based on a reset signal or operation start signal; and a mode setting circuit for making one of burn-in setting and test mode setting respectively in response to the burn-in mode signal and the test mode signal, whichever inputted, and for making normal mode setting upon input of the normal mode signal.

According to the above structure, the auto-clear circuit outputs an auto-clear signal to the mode signal generating circuit as soon as the power source is supplied to the integrated circuit device. Accordingly, the mode signal generating circuit generates a burn-in mode signal or test mode signal based on the auto-clear signal to send the resulting signal to the mode setting circuit. Then, the mode setting circuit makes one of the burn-in setting and test mode setting respectively in response to the burn-in mode signal and test mode signal, whichever inputted. As a result, the burn-in or test mode operation is run on the internal circuit of the integrated circuit device.

On the other hand, upon input of the reset signal or operation start signal, the mode signal generating circuit generates a normal mode signal based on the received signal, and sends the normal mode signal to the mode setting circuit. Then, the mode setting circuit makes the normal mode setting in response to the normal mode signal. As a result, the normal mode operation is performed on the internal circuit of the integrated circuit device.

The above structure makes it possible to omit the test mode-setting-only input terminal causing the aforementioned problems. Thus, a system employing the integrated circuit device of the present invention can be designed more flexibly and downsized as well.

In addition, the above structure enables the automatic making of the burn-in setting or test mode setting only by supplying the power source. Thus, when an operation test, such as the burn-in, is run on a plurality of the integrated circuit devices in parallel, the time required to connect the testing device and individual integrated circuit devices through lines can be saved drastically.

Further, the burn-in setting or test mode setting is cleared upon input of a signal which is necessary to start the normal operation. That is to say, the operation start signal or reset signal is used as a signal clearing the burn-in setting or test mode setting, thereby obviating a clearing-only signal. As a result, it has become possible to significantly reduce the time and labor required to set such a clearing-only signal.

For a fuller understanding of the nature and advantages of the invention, reference should be made to the ensuing detailed description taken in conjunction with the accompanying drawings.

DESCRIPTION OF THE EMBODIMENTS

Figure 1:
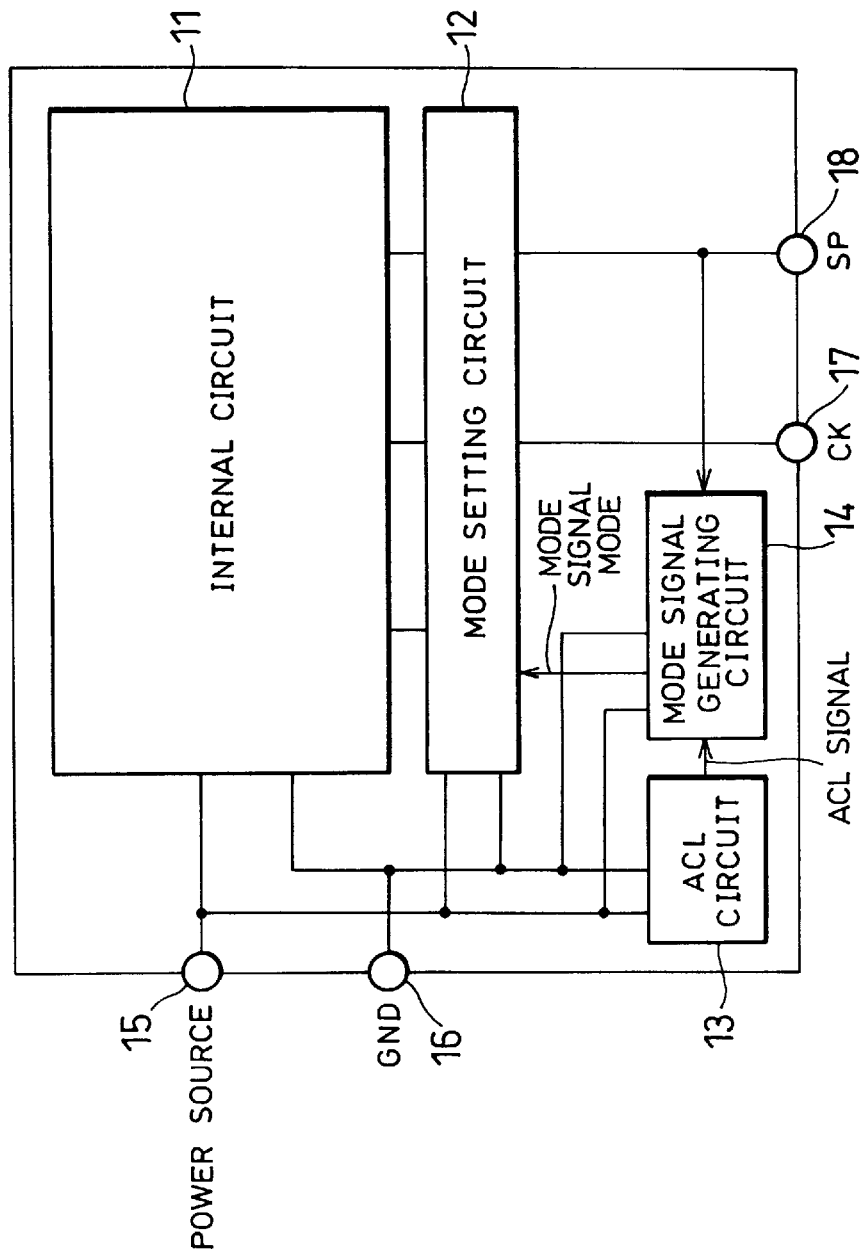
FIG. 1 is a block diagram depicting an example structure of an integrated circuit device in accordance with the present invention.
Figure 2:
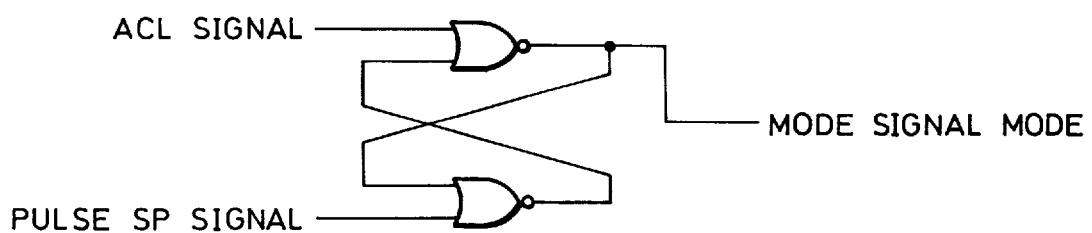
FIG. 2 is a schematic circuit diagram showing an example structure of a mode signal generating circuit of FIG. 1.
Figure 3:
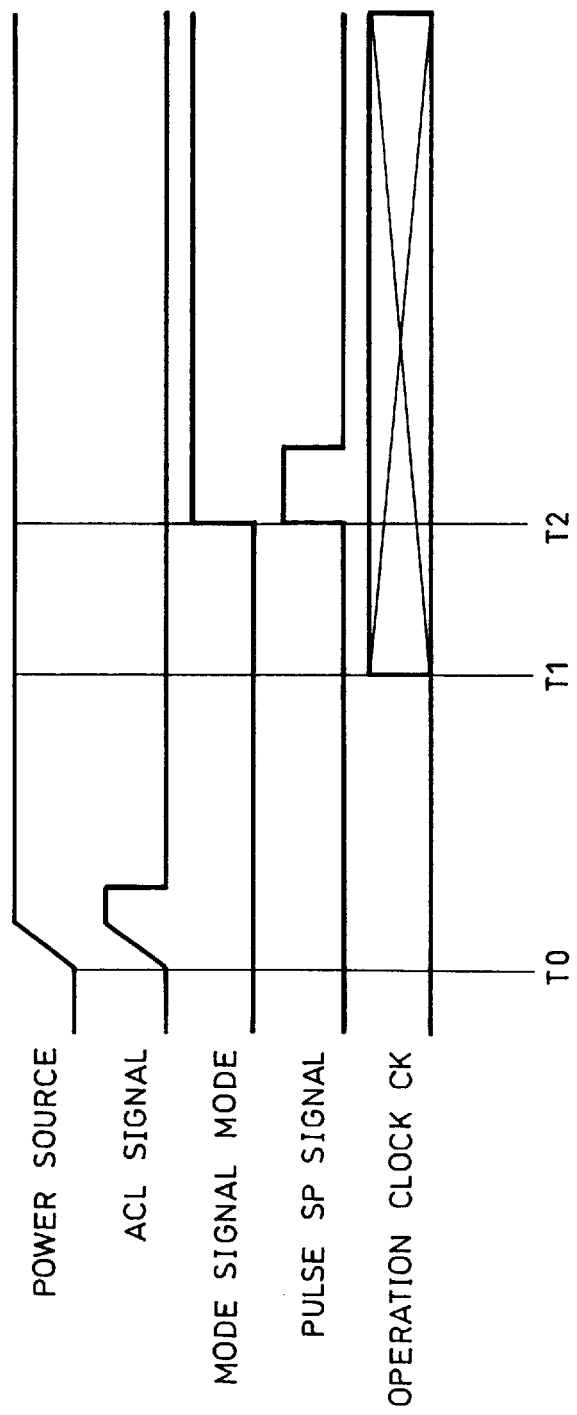
FIG. 3 is a timing chart showing example operation timing of the integrated circuit device in accordance with the present invention.

Referring to FIGS. 1 through 3, the following description will describe an example embodiment of the present invention.

FIG. 1 is a view depicting an example structure of an integrated circuit device in accordance with the present invention, and it shows a structure capable of making the burn-in setting or test mode setting.

In FIG. 1, numeral 11 denotes an internal circuit and numeral 12 denotes a mode setting circuit. The mode setting circuit 12 makes one of the burn-in setting and test mode setting respectively in response to a burn-in mode signal and a test mode signal, whichever inputted. The mode setting circuit 12 also makes the normal mode setting in response to input of a normal mode signal.

In FIG. 1, numeral 13 denotes an auto-clear circuit (ACL circuit) for outputting an auto-clear signal (ACL signal) in response to a supply of the power source, and numeral 14 denotes a mode signal generating circuit for generating a mode signal MODE and outputting the same to the mode setting circuit 12 to switch the operation modes.

The mode signal generating circuit 14 outputs the burn-in mode signal or test mode signal (either of which exhibiting "L" (binary low level)) to the mode setting circuit 12 based on the ACL signal. On the other hand, the mode signal generating circuit 14 outputs the normal mode signal (exhibiting "H" (binary low level)) to the mode setting circuit 12 based on a reset signal or operation start signal.

In FIG. 1, numeral 15 denotes a power source terminal, numeral 16 denotes a ground terminal (GND), numeral 17 denotes a terminal (CK) into which an operation clock (CK) is inputted, and numeral 18 denotes a terminal (SP) into which the operation start signal or reset signal is inputted.

Figure 4:
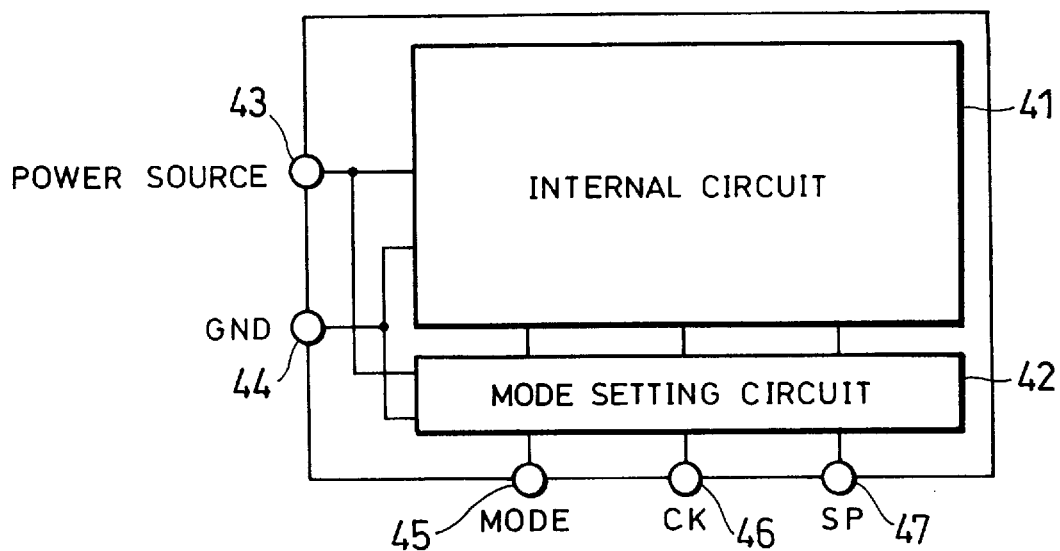
FIG. 4 is a block diagram depicting a structure of a conventional integrated circuit device.
Figure 5:
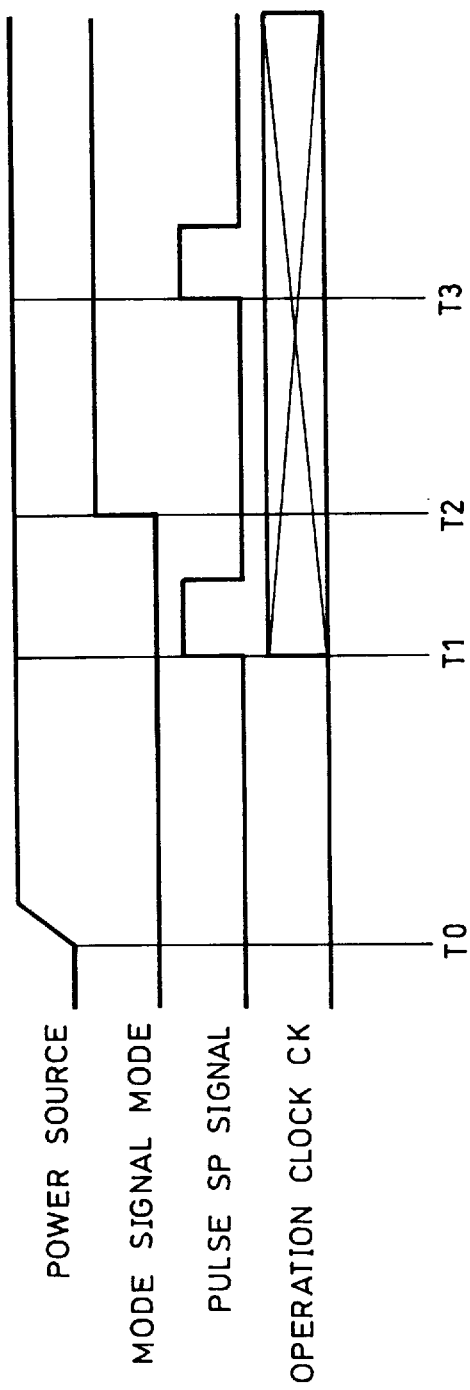
FIG. 5 is a timing chart showing operation timing of the conventional integrated circuit device.

Compared with the conventional circuit structure of FIG. 4, the circuit structure of FIG. 1 omits the mode-setting-only input terminal 45 and additionally includes two circuits: the ACL circuit 13 for generating a reset signal (ACL signal) for resetting the mode setting circuit 12 that automatically makes the burn-in setting or test mode setting of the integrated circuit as soon as the power source is supplied, and the mode signal generating circuit 14 for switching the operation modes.

The space occupied by the additionally included ACL circuit 13 and mode signal generating circuit 14 is negligible with respect to the entire integrated circuit device. Thus, adding these two circuits increases neither the size nor the costs of the integrated circuit device. It should be noted that some types of the conventional integrated circuit devices already include the above ACL circuit to stabilize the operation immediately after the power source is supplied, and such integrated circuit devices only have to include the mode signal generating circuit 14 as an additional component.

A mode signal MODE from the mode signal generating circuit 14 makes the integrated circuit device perform in the same manner as the mode signal MODE outputted in the conventional counterpart of FIG. 4. That is to say, as soon as the power source is supplied, the ACL signal is outputted from the ACL circuit 13 to the mode signal generating circuit 14, which accordingly outputs a mode signal MODE exhibiting "L" to the mode setting circuit 12 in the conventional manner. As a result, the mode setting circuit 12 makes the burn-in setting or test mode setting to start the test operation.

To clear the burn-in setting or test mode setting, a pulse SP signal (staying at "H" for a predetermined period), which is in effect the operation start signal, is sent to the mode signal generating circuit 14 through the input terminal 18 (SP). Then, the mode signal MODE outputted from the mode signal generating circuit 14 shifts to "H" from "L". As a result, the operation mode is switched to the normal operation mode from the burn-in setting or test mode setting.

Any popular RS (Reset-Set) latch circuit can serve as the mode signal generating circuit 14, and an example of which is depicted in FIG. 2. According to the structure of FIG. 2, when the ACL signal (one of the two input signals to the RS latch circuit) shifts to "H", then the mode signal MODE (an output signal from the RS latch circuit) is latched at "L". In contrast, when the pulse SP signal (the other input signal to the RS latch circuit) shifts to "H", the mode signal MODE is latched at "H". Therefore, using the RS latch circuit of FIG. 2 as the mode signal generating circuit 14 enables the integrated circuit device of the present embodiment to operate in the same manner as the conventional counterpart.

Figure 6:
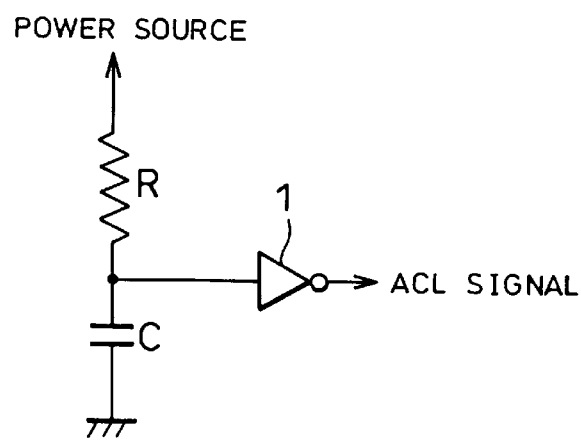
FIG. 6 is a schematic circuit diagram showing an example structure of an auto-clear circuit of FIG. 1.

Next, the ACL circuit 13 will be detailed in the following with reference to FIG. 6. As shown in FIG. 6, the ACL circuit 13 comprises, for example, a resistor R, a condenser C, and an inverter circuit 1. The resistor R is connected to the power source at one end and connected to one of the two ends of the condenser C at the other end. The other end of the condenser C is connected to the ground. The connecting point of the resistor R and condenser C is connected to the input terminal of the inverter circuit 1, and the ACL signal is outputted from the output terminal of the inverter circuit 1.

According to the structure of FIG. 6, when the power source is supplied, the potential of the connecting point rises based on a time constant determined by the resistor R and condenser C. In other words, the connecting point stays at "L" for a predetermined period after the power source is supplied, during which an ACL signal exhibiting "H" is outputted from the inverter circuit 1 to the mode signal generating circuit 14. As a result, the burn-in setting or test mode setting is made. After the predetermined time has passed, the connecting point shifts from "H" to "L", and an ACL signal exhibiting "L" is outputted from the inverter circuit 1 to the mode signal generating circuit 14. The auto-clear operation thus described is automatically performed by the circuit of FIG. 6 as soon as the power source is supplied.

Next, the operation timing of the integrated circuit device of the present embodiment will be described with reference to FIG. 3.

FIG. 3 is a timing chart showing the operation timing of the integrated circuit device of FIG. 1. As shown in FIG. 3, when the power source is supplied at timing T0, an ACL signal is generated by the ACL circuit 13 and sent to the mode signal generating circuit 14. Then, a mode signal MODE exhibiting "L" is outputted to the mode setting circuit 12 from the mode signal generating circuit 14. As a result, as long as the mode signal MODE exhibiting "L" is outputted from the mode signal generating circuit 14 after the power source is supplied, the normal operation is not performed and the burn-in operation or test mode operation is performed.

An operation clock CK is inputted into the input terminal 17 (CK) at timing T1. However, since the mode signal MODE stays at "L", the operation mode remains in the burn-in setting or test mode setting.

A pulse SP signal staying at "H" for a predetermined period is sent to the mode signal generating circuit 14 through the input terminal 18 (SP) at timing T2. At this point, the mode signal MODE outputted from the mode signal generating circuit 14 shifts to "H" from "L". As a result, the operation mode is switched to the normal operation mode from the burn-in setting or test mode setting. The normal operation starts when the operation clock CK is inputted into the input terminal 17 (CK) under these conditions.

The above description describes an example where the operation mode is switched to the normal operation mode upon input of the pulse SP signal, but the present invention is not limited to the above disclosure. Alternatively, the operation mode may be switched to the normal operation mode when the pulse SP signals are counted up to a predetermined number, or the operation clock CK's are counted up to a predetermined number after one pulse SP signal is detected. According to the alternative arrangements, a highly reliable integrated circuit device that does not cause malfunction in response to noises or the like can be assembled.

Figure 7:
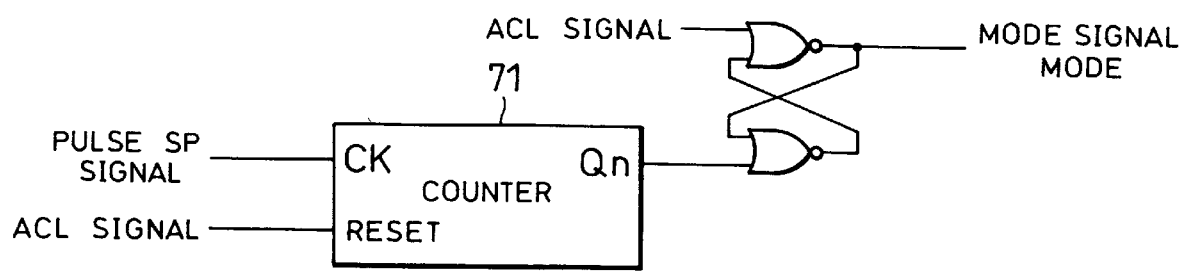
FIG. 7 is a schematic circuit diagram showing a structure of another mode signal generating circuit in accordance with the present invention.

FIG. 7 shows an example structure of the mode signal generating circuit in accordance with the above first alternative. In FIG. 7, numeral 71 denotes a counter, such as a binary counter. The counter 71 receives an ACL signal (FIG. 3) at the reset input terminal and a pulse SP signal (FIG. 3) at the clock input terminal (CK). The counter 71 is connected to one of the two input terminals of the RS latch circuit (FIG. 2) at the output terminal $Q_n$. The other input terminal of the RS latch circuit receives the ACL signal.

According to the structure of FIG. 7, upon input of the ACL signal, the counter 71 performs the reset operation first, and thence starts the counting operation in response to input of the pulse SP signal following the ACL signal. Parallel with the reset operation of the counter 71, the RS latch circuit outputs a mode signal MODE exhibiting "L" to the mode setting circuit 12 to make the burn-in setting or test mode setting. The burn-in setting or test mode setting is made because the ACL signal is inputted into one of the two input terminals of the RS latch circuit, and when the ACL signal shifts to "H", the output signal is latched at "L". On the other hand, when the counter 71 counts the pulse SP signals up to a predetermined number (for example, n), a signal exhibiting "H" is sent to the other input terminal of the RS latch circuit from the output terminal $Q_n$. Thus, the output from the RS latch circuit is latched at "H" and outputted to the mode setting circuit 12 as the mode signal MODE. As a result, the operation mode is switched to the normal operation mode. This is how the operation mode is set and cleared in the first alternative.

Figure 8:
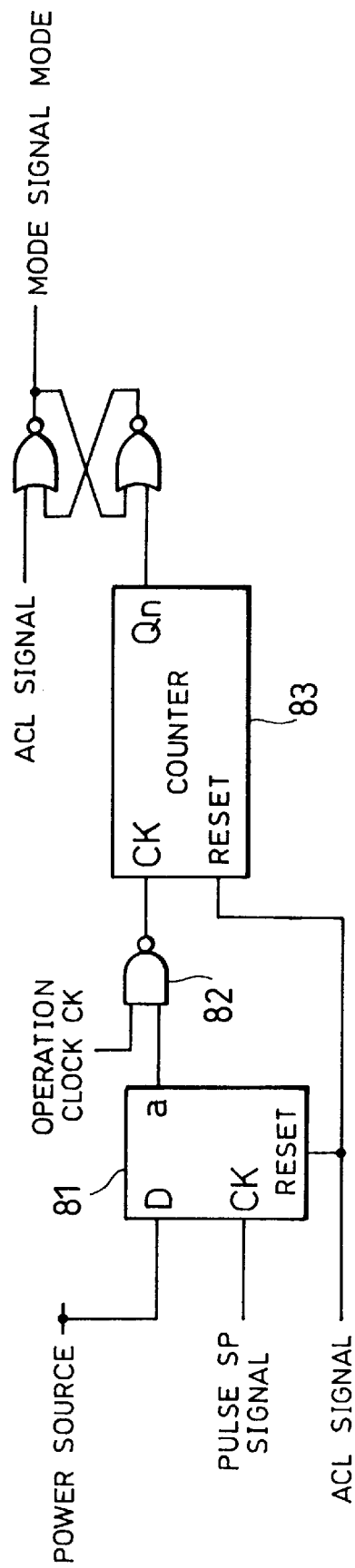
FIG. 8 is a schematic circuit diagram showing a structure of still another mode signal generating circuit in accordance with the present invention.

FIG. 8 shows an example structure of the mode signal generating circuit in accordance with the above second alternative. In FIG. 8, numeral 81 denotes a D-type flip-flop, numeral 82 denotes an AND circuit, and numeral 83 denotes a counter, such as a binary counter. The D-type flip-flop 81 can be replaced with a half latch, and selection between these two components is made depending on whether the pulse SP signals are counted in sync with the rising edge or falling edge.

The D-type flip-flop 81 includes a data input terminal (D), a clock input terminal (CK), a reset input terminal, and an output terminal Q. The data input terminal (D) is connected to the power source. A pulse SP signal is inputted into the clock input terminal (CK), while the ACL signal is inputted into the reset input terminal. The output terminal Q is connected to one of the two input terminals of the AND circuit 82, and the operation clock CK is inputted into the other input terminal of the AND circuit 82.

The counter 83 includes a clock input terminal (CK), a reset input terminal, and an output terminal $Q_n$. The clock input terminal (CK) is connected to the output terminal of the AND circuit 82. The ACL signal is inputted into the reset input terminal. The output terminal $Q_n$ is connected to one of the two input terminals of the RS latch circuit (FIG. 2), and the ACL signal is inputted into the other input terminal.

According to the structure of FIG. 8, upon input of the ACL signal, the RS latch circuit outputs a mode signal MODE exhibiting "L" to the mode setting circuit 12 to make the burn-in setting or test mode setting. The burn-in setting or test mode setting is made because the ACL signal is inputted into one of the input terminals of the RS latch circuit, and when the ACL signal shifts to "H", the output signal is latched at "L".

Upon input of the ACL signal, the D-type flip-flop 81 and counter 83 start the reset operation. Upon input of the pulse SP signal after the reset operation, a signal exhibiting "H" is outputted to the AND circuit 82 from the output terminal Q of the D-type flip-flop 81.

Upon receipt of the signal exhibiting "H", the AND circuit 82 transfers the operation clock CK to the counter 83. In contrast, after the reset operation, a signal exhibiting "L" is sent to the AND circuit 82 from the output terminal Q of the D-type flip-flop 81 until the pulse SP signal is inputted. Thus, the AND circuit 82 does not transfer the operation clock CK to the counter 83.

When the operation clock CK is sent to the counter 83 through the AND circuit 82, the counter 83 starts the counting operation. When the counter 83 counts the operation clocks CK's up to a predetermined number (for example, n), the counter 83 sends a signal exhibiting "H" to one of the two input terminals of the RS latch circuit from the output terminal $Q_n$. Accordingly, the output from the RS latch circuit is latched at "H", and outputted to the mode setting circuit 12 as the mode signal MODE. As a result, the operation mode is switched to the normal operation mode. This is how the operation mode is set and cleared in the second alternative.

As has been explained, the integrated circuit device of the present embodiment includes (1) the auto-clear circuit for outputting an auto-clear signal in response to a supply of the power source, (2) the mode signal generating circuit for generating a burn-in mode signal or test mode signal based on the auto-clear signal, and for generating a normal mode signal based on a reset signal or operation start signal, and (3) the mode setting circuit for making one of the burn-in setting and test mode setting respectively in response to the burn-in mode signal and test mode signal, whichever inputted, and for making the normal operation setting in response to input of the normal operation signal.

According to the above structure, the mode-setting-only input terminal, which used to be provided separately only to make the burn-in setting and test mode setting, is no longer necessary (in other words, the mode-setting-only input terminal causing the aforementioned problems can be omitted). Thus, a system employing the integrated circuit device of the present invention can be designed more flexibly and downsized as well.

In addition, the burn-in setting or test mode setting is made automatically only by supplying the power source. Thus, when an operation test, such as the burn-in, is run on a plurality of the integrated circuit: devices in parallel, the time required to connect the testing device and individual integrated circuit devices through lines can be saved drastically.

Further, the burn-in setting or test mode setting is cleared upon input of a signal necessary to start the normal operation. That is to say, the operation start signal or reset signal is used as a signal clearing the burn-in setting or test mode setting, thereby obviating a clearing-only signal. As a result, it has become possible to significantly reduce the time and labor required to set such a clearing-only signal.

It is preferable that the mode signal generating circuit is made of a RS latch circuit that is set (reset) by the ACL signal and reset (set) by the reset signal or operation start signal. In this case, the mode signal generating circuit can be integrated by a simple structure. Thus, neither the space nor the cost of the mode signal generating circuit is increased.

In other words, according to the present invention, a period since the power source is supplied until the normal operation starts upon input of the operation start signal and operation clock (this is the period during which the conventional integrated circuit device becomes unstable and hence has not been utilized) is utilized to make the burn-in setting or test mode setting without using any mode-setting-only signal. Accordingly, the mode-setting-only input terminal and the signal clearing the operation mode can be omitted, both of which are indispensable in the conventional integrated circuit device.

Also, it is preferable that a circuit generating an operation clock CK is installed in the integral circuit device. Because this arrangement can omit the terminal 17 (CK) into which the operation clock CK is inputted, and therefore, when an operation test, such as the burn-in, is run on a plurality of the integrated circuit devices in parallel, the time required to connect the testing device and individual integrated circuit devices through lines can be saved drastically.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit device comprising:

an auto-clear circuit for outputting an auto-clear signal in response to a supply of a power source;

a mode signal generating circuit for generating a first mode signal for starting a test operation based on said auto-clear signal, and a second mode signal for shifting from a test mode operation to a normal operation upon external input of one of a reset signal and an operation start signal; and a mode setting circuit for setting the test operation upon input of said first mode signal and for setting the normal operation upon input of said second mode signal.

2. The integrated circuit as defined in claim 1, wherein said mode signal generating circuit is a reset-set latch circuit, said auto-clear signal being inputted into one of two input terminals of said reset-set latch circuit, while the second mode signal being inputted into the other input terminal of said reset-set latch circuit, one of said first mode signal, and second mode signal being sent to said mode setting circuit through an output terminal of said reset-set latch circuit.

3. The integrated circuit device as defined in claim 1, wherein said auto-clear circuit includes a resistor, a condenser, and an inverter circuit, said resistor being connected to a power source at one end and being connected to one of two ends of said condenser at the other end, the other end of said condenser being connected to a ground, a connecting point of said resistor and said condenser being connected to an input terminal of said inverter circuit, said auto-clear signal being outputted from an output terminal of said inverter circuit.

4. The integrated circuit device as defined in claim 1, wherein said mode signal generating circuit includes a reset-set latch circuit and a counter having a clock input terminal, a reset input terminal, and an output terminal, said auto-clear signal being inputted into said reset input terminal, said second mode signal being inputted into said clock input terminal, said output terminal being connected to one of two input terminals of said reset-set latch circuit, while said auto-clear signal being inputted into the other input terminal, one of said first mode signal, and second mode signal being sent to said mode setting circuit through an output terminal of said reset-set latch circuit.

5. The integrated circuit device as defined in claim 1, wherein said mode signal generating circuit includes:

a reset-set latch circuit;

a counter having a clock input terminal, a reset input terminal, and an output terminal, an AND circuit; and a D-type flip-flop having a clock input terminal, a data input terminal into which said power source is supplied, a reset input terminal, and an output terminal, said auto-clear signal being inputted into said counter and said D-type flip-flop at their respective reset input terminals, said second mode signal being inputted into said clock input terminal of said D-type flip-flop, an operation clock being inputted into one of two input terminals of said AND circuit, while the other input terminal being connected to said output terminal of said D-type flip-flop, said output terminal of said counter being connected to one of two input terminals of said reset-set latch circuit, while said auto-clear signal being inputted into the other input terminal, one of said first mode signal, and first mode signal being sent to said mode setting circuit through an output terminal of said reset-set latch circuit.

* * * * *